United States Patent [19]

Schlosser et al.

[11] 4,292,645
[45] Sep. 29, 1981

[54] CHARGE SPLITTING RESISTIVE LAYER FOR A SEMICONDUCTOR GAMMA CAMERA

[75] Inventors: Philip A. Schlosser, Columbus; Don W. Miller, Westerville, both of Ohio

[73] Assignee: Picker Corporation, Cleveland, Ohio

[21] Appl. No.: 86,464

[22] Filed: Oct. 19, 1979

[51] Int. Cl.³ .......................................... H01L 27/14
[52] U.S. Cl. ...................... 357/29; 357/30; 357/58; 357/51; 357/31; 250/370
[58] Field of Search ................ 357/29, 30, 58, 51, 357/31; 250/370

[56] References Cited

U.S. PATENT DOCUMENTS

| | | | |
|---|---|---|---|
| 3,691,389 | 9/1972 | Ellis | 250/211 J |
| 3,761,711 | 9/1973 | Hall | 250/370 |
| 4,029,965 | 6/1977 | Carlson | 250/370 |
| 4,047,037 | 9/1977 | Schlosser | 250/370 |
| 4,055,765 | 10/1977 | Gerber | 250/370 |
| 4,055,766 | 10/1977 | Miller | 250/370 |
| 4,163,240 | 7/1979 | Swinehart | 357/29 |

Primary Examiner—Martin H. Edlow
Attorney, Agent, or Firm—Watts, Hoffmann, Fisher & Heinke Co.

[57] ABSTRACT

An improved semiconductor gamma camera is disclosed. The gamma camera includes a p-i-n semiconductor diode which detects the presence and energy of gamma radiation from a source. Typically the source is radioactive material in a patient organ which is detected and then interpreted by a doctor while diagnosing the condition of that organ. The detector includes an improved electrical connection technique to allow the p-i-n diode to be connected to electronic circuitry necessary to provide spatial and energy information. In the improved camera first a passivation layer is deposited on both faces of the p-i-n diode and then a resistive layer is applied to form a reliable easily reproduced electrical contact to the junction. These two layers in combination prevent foreign matter from contacting the semiconductor material comprising the detector while providing interconnection to the electronic circuitry.

8 Claims, 6 Drawing Figures

CHARGE SPLITTING RESISTIVE LAYER FOR A SEMICONDUCTOR GAMMA CAMERA

BACKGROUND OF THE INVENTION

1. Field of the Invention

The present invention relates to an improved method and apparatus for a semiconductor gamma camera.

2. Prior Art

It is known within the art of medical diagnostic testing to utilize radioactive materials in determining a patient's condition. More specifically, the patient is administered a radioactive material which tends to concentrate itself with one or more particular patient organs or body parts. When this material concentrates itself within an organ it is possible, by utilizing radiation detection techniques, for a physician to observe and monitor the structure of a particular organ. From this information it is possible for the physician to diagnose the condition of that organ and therefore better treat the patient's condition.

One type of prior art radiation detection technique utilizes an "Anger" type gamma scintillation camera for determining the concentration and distribution of radioactive material as radiation is emitted from the patient's body. The Anger camera converts the radiation first into light energy and then into corresponding electrical impulses which are processed by imaging electronics to provide a display of radiation distribution. This technique, while of considerable utility, is limited in its ability to measure the energy of the radiation emitted from the patient and therefore the quality of the final image is less than optimum.

It has been subsequently proposed to bystep the conversion of radiation to visible light, as in the Anger camera, and convert radiation directly to electrical signals and therefore to improve spatial and energy resolution of the camera and of the displayed information, and provide for more efficient gamma radiation detection. In this newer technique the electromagnetic radiation (typically gamma ray radiation) impinges on intrinsic semiconductor material on which is imposed a high strength electric field. The gamma ray radiation impinging upon the structure of the semiconductor material produces holes and electrons within the material which, due to the influence of the electric field, are caused to separate and move toward opposite surfaces of the semiconductor material in accordance with their respective electrical charge polarities. After travel to opposed sides of the semiconductor material, the electron and holes are processed by decoding resistor circuits and attached imaging electronics to produce electrical signals indicating the location and energy content of the corresponding incident electromagnetic radiation. Prototype cameras embodying this principle (called "solid state" cameras) have been demonstrated and their improved performance capabilities confirmed.

In the typical fabrication of a solid state gamma camera, a high purity silicon or germanium crystal is utilized. This crystal forms the basis for a p-i-n diode with a large intrinsic region where charge carriers (holes and electrons) are created in response to electromagnetic radiation. The p-i-n diode is provided by doping opposed surfaces of a crystal with p and n type impurities or by forming metal rectifying contacts. The resulting p-i-n diode is reverse biased by an externally supplied electrical potential. Under these circumstances a large depletion volume can be maintained in the intrinsic region. When the electromagnetic radiation (typically gamma rays) impinges upon the semiconductor material, holes and electrons are formed.

If the spatial location of the incident radiation is to be determined as well as the energy content, the contacts are deposited upon the semiconductor material in a specific and well defined pattern. One technique utilized to provide information regarding the location of incoming radiation involves the deposition of bands of p and n doped material on the opposite surfaces of the semiconductor material. On one surface, only p doped material is utilized. This material is arranged in a series of bands or strips which form a parallel configuration of alternately doped and nondoped regions. On an opposed surface of the semiconductor material, the n doped bands are arranged parallel to each other but in a direction orthogonal to that of the p doped material. Each of the parallel bands of doped material is connected to a resistive network of discrete components.

To achieve this connection, each of the p and n doped materials must be electrically connected to this resistive network. Details of a location determining technique using a resistive network can be found in a publication entitled "A Practical Gamma Ray Camera System Using High Purity Germanium" published in the Feb. 1974 issue of IEEE Trans Nuc Sci and prepared by the Ohio State University Department of Nuclear Engineering under the auspices of a National Institutes of Health contract. That reference is incorporated by reference in the present patent application.

To provide more spatial information content or resolution, a greater number of parallel bands of n and p doped material are required. For each parallel band of p and n doped material, two electrical contacts must be made to the array of discrete component resistors. These resistor elements are attached to charge measuring circuitry in a manner illustrated in the referenced article. As the size of the semiconductor material increases, the number of electrical contacts on the doped bands increases as does the cost and complexity of the resistive networks necessary to obtain location information.

The semiconductor materials used to construct an improved resolution gamma camera are extremely pure and extreme care must be taken to insure the composition integrity of these semiconductors. Under these circumstances, it has been found that constructing the discrete component resistance networks and attaching them to the doped regions of the semiconductor gamma camera contributes significantly to the cost of such cameras.

SUMMARY OF THE INVENTION

The present invention provides a new technique for constructing position and energy resolving solid state radiation detectors suitable for imaging in nuclear medicine. The technique obviates the need for attaching discrete component elements to the detector for collecting and processing electrical charge generated by incident radiation. The invention also eliminates the need for making electrical connections directly to doped regions of a gamma camera's semiconductor junction.

As is known, fabrication of a solid state gamma camera begins with the growing of a crystal of high purity germanium. A so-called p-i-n diode is formed by doping opposed surfaces of the germanium with impurity materials. A donor (n) material is implanted on one surface and a blocking junction formed on an opposing surface. The blocking junction can be formed by either doping the opposing surface with acceptor (p) material or by forming a metal rectifying junction. According to the invention a doped region of the p-i-n diode thus formed is then covered by a passivation layer and then a resistive material. The passivation layer provides protection in handling the device and serves to maintain the integrity of the doped and intrinsic regions of the detector. The resistive layer takes the place of the discrete resistances necessitated by the prior art designs. In order that the resistive layer contact the p-i-n diode, it is necessary that resistive material comprising the resistive layer extend through the passivation layer to the doped regions of the detector. In this way reliable electrical contacts can be easily formed while the physical integrity of the detector is maintained.

In a preferred embodiment of the detector, the doped regions of the construction are aligned in bands which provide spatial information to the detector. A series of parallel n doped bands are provided to one surface of the detector and an orthogonally arranged series of p doped or metal rectifying bands are provided on an opposite surface of the detector. These bands of doped material are either formed on a planar detector region or on a semiconductor configuration where grooves are formed in the intrinsic region between the doped bands. Once these bands have been formed upon the intrinsic material (typically germanium) a passivation layer is deposited upon both the intrinsic and doped regions of the detector. A gap is left in the passivation region to allow a resistive element to deposit through the gap and contact the doped regions of the detector. The resistive region is applied over the passivation region and provides an easily fabricated resistive layer which takes the place of the discrete resistors required by prior art detectors. Two electrical contacts are placed on opposite edges of the resistive layer to provide a path for electrical signals to be sent to imaging electronics removed from the detector surface.

The preferred embodiment of the invention provides an easily reproduced method of construction for a spatial and energy resolving gamma detector. The user can directly touch the resisitive or passivation layers without harming the detector and it is no longer necessary for the electrical contacts to be placed directly on the doped regions of the detector. The difficult to construct discrete resistive array using small resistor components need not be used since the easily applied resistive layer takes its place.

From the above it is apparent that one object of the present invention is to provide an easily reproduced technique for providing spatial and energy sensing gamma ray detectors. The layering of resistive and passivation sheets serves to maintain the integrity of the doped and intrinsic materials comprising the detector and also results in an easier technique for fabrication.

Other objects and features of the present invention will become understood when considered with a detailed description of one preferred embodiment of the invention as depicted in the accompanying drawings.

DESCRIPTION OF PREFERRED EMBODIMENT

Figure 1:
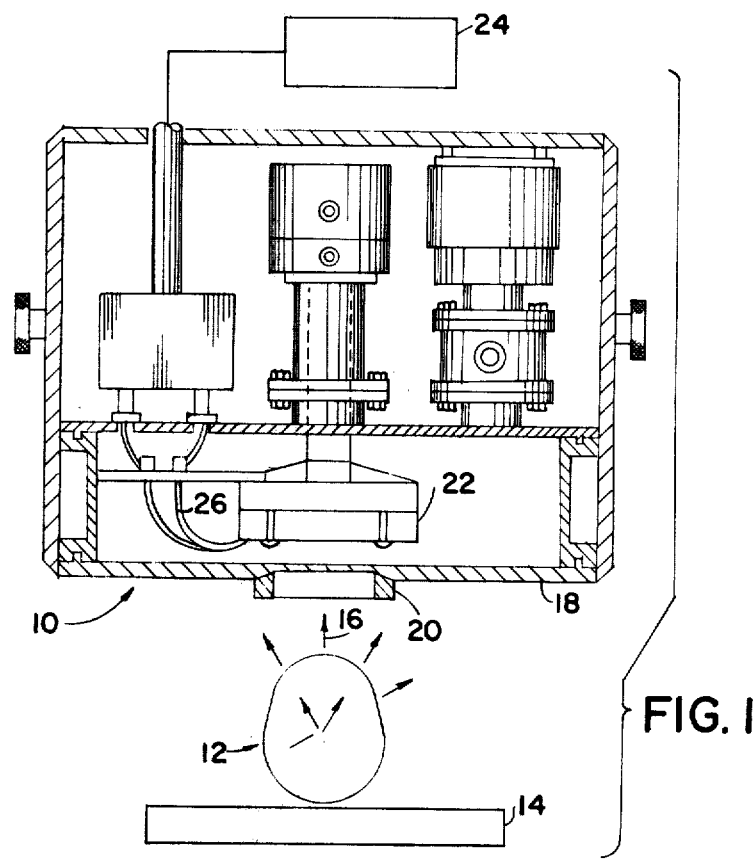
FIG. 1 is a representation of a gamma camera system positioned to detect gamma radiation.

Referring now to the diagrams in general and FIG. 1 in particular, a gamma camera system 10 is shown positioned above a source 12 of electromagnetic radiation 16. This radiation is typically of the energy spectrum known as gamma ray radiation although other types of radiation can be suitably utilized in conjunction with the present gamma camera. Although depicted schematically, this source might correspond to an organ within a human body positioned on a table or support 14.

The system 10 includes a detector 22 mounted within a housing 18. Before the gamma ray radiation 16 interacts with the detector 22, it is collimated by a collimator structure 20. The interaction of the radiation 16 with the detector 22 provides electrical signals which are sent to imaging electronics 24 by means of cabling 26. In this way both the energy and spatial information of the impinging radiation can be ascertained. This information is derived from the characteristics of electrical signals which are produced by energy conversion occuring within the detector 22.

Figure 2:
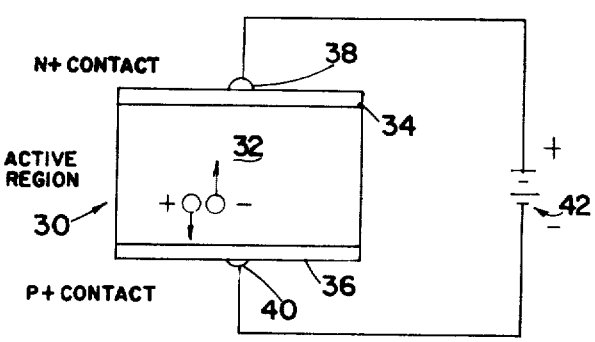
FIG. 2 shows a p-i-n semiconductor diode for use in a gamma camera.

FIG. 2 illustrates a technique for converting electromagnetic radiation into electrical energy and thereby providing signals for the imaging electronics 24. FIG. 2 shows a radiation detecting portion 30 of the detector 22 which includes an intrinsic area 32 of semiconductor material such as germanium and two doped regions 34, 36. These regions are created by doping a portion of the intrinsic semiconductor 32 with p and n type materials. One suitable n type material is lithium or boron and a suitable p type material is boron. A metal rectifying junction formed by evaporation of gold or palladium onto the intrinsic semiconductor may be substituted for the p-type junction.

Electrical contacts 38, 40 are attached to the n and p type material regions to facilitate the transmittal of electrical signals to and from those regions. These contacts are also attached to a battery or other source of voltage 42 to provide a reverse bias to the p-i-n diode arrangement depicted. This reverse bias results in the creation of a large electric field throughout the intrinsic region 32 of the semiconductor material.

In operation, electromagnetic radiation 16 impinges upon the detector 22 and in particular the active detector portion 30. When this radiation comes in contact with the intrinsic 32 semiconductor material, the electromagnetic radiation energy creates electron/hole pairs within the intrinsic material. The large electric field provided by the voltage source 42 causes the holes and electrons to move in opposite directions. These electron/hole combinations are accelerated towards the n and p regions 34, 36 and generate a current which is proportional to the energy of the impinging radiation. Known techniques allow the location of electromagnetic radiation to be determined as well as the energy content of that radiation.

Figure 3:
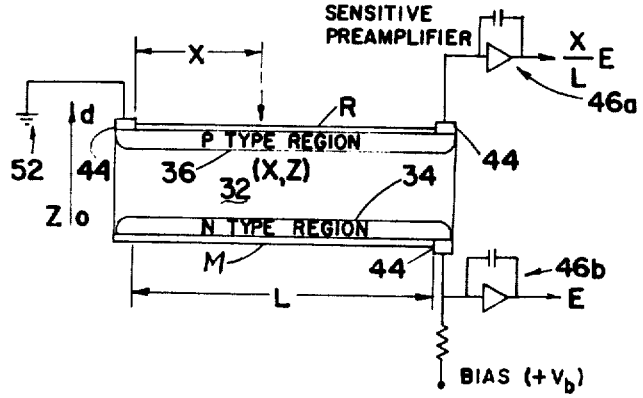
FIG. 3 shows a p-i-n diode with circuitry attached for position and energy measurement of impinging electromagnetic radiation.

An arrangement for providing energy and spatial resolution information by utilization of a semiconductor gamma camera is illustrated in FIG. 3. A portion of a gamma camera is shown which includes an intrinsic 32 and two doped 34, 36 regions to which a layer of resistive material R and a metal conductive layer M have been added, respectively. The resistive layer R is added to a spatial side and the metal conductive layer to an energy side. The layers may be interchanged and added to either the p or the n doped regions. Thus, the resistive layer may alternatively be added to the n type region 34 and the metal conductive layer may be added to the p type region 36. Electrical contacts 44 have been attached to these two resistive layers. These contacts allow the current generated by the electromagnetically induced hole/electron production occurring within the intrinsic semiconductor material to reach detecting circuits 46a, b attached to those contacts. Because of the charge splitting effect in the resistive layer R, the detector circuit 46a provides spatial information of the incoming electromagnetic radiation. The detector circuit 46b provides energy information.

Operation of a typical semiconductor gamma camera as a position sensitive detector can be understood by considering a one-dimensional example. Assume in FIG. 3 the detector includes an intrinsic region 32, a p type layer 36 and an n type layer 34. If a gamma ray interacts at some point (x, z) in the intrinsic region, a cloud of electrons and holes migrate to the two positions (x, d) and (x, 0), respectively. The hole charge contacts the metal conductive layer M and is transmitted to an energy-channel charge preamplifier 46b and produces an output E, which is proportional to the total charge $Q_o$ of the hole cloud. This total charge $Q_o$ is proportional to the total energy lost by the gamma ray and thus the gamma camera provides energy information regarding the incoming radiation.

The equal and opposite charge of the electron cloud, contacts the resistive layer at (x, d) and sees a resistance divider consisting of a resistance Rx/L going to a ground 52 and a resistance R(L−x)/L going to the charge preamplifier 46a, a virtual earth (where R is the total one dimensional resistance of the contact and L is the length of the detector portion). The amount of charge entering the position charge preamplifier is $$Q = Q_o \left( \frac{Rx/L}{Rx/L + R(L-x)/L} \right) = \frac{x}{L} Q_o$$

which is proportional to (x/L)E. Thus, the voltage output of the charge amplifier 46a is proportional to x, the position of gamma ray incidence on the detector.

From the above it should be appreciated that the output of one amplifier 46b yields energy information and the output from the second amplifier 46a yields spatial location information.

Figure 4:
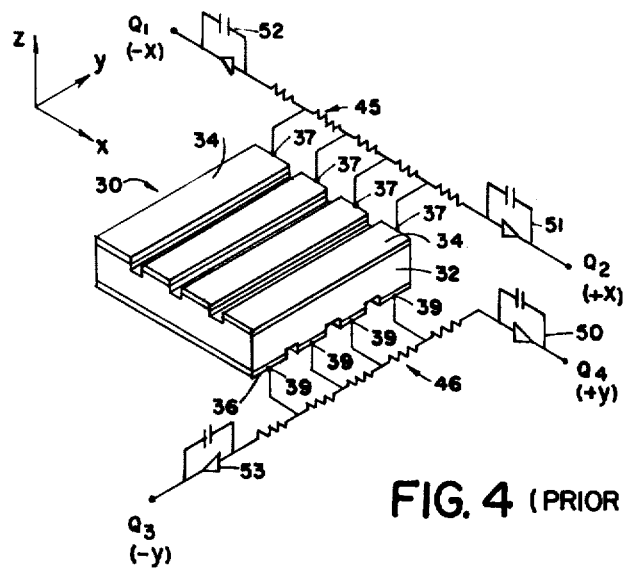
FIG. 4 shows a prior art technique with circuitry attached to a p-i-n diode for two dimensional position and energy measurement of impinging electromagnetic radiation.

A state of the art two dimensional gamma ray detector is shown in FIG. 4. The two dimensional technique for determining position of incoming gamma radiation is extrapolated from the one dimensional derivation. In the detector shown in FIG. 4, the x coordinate of radiation is determined from the charge swept to one doped surface and the y coordinate is determined by the charge swept to an opposed doped surface. Energy information is determined by summation of the total charge from either the x or y coordinate surface.

The construction technique shown requires orthogonal strips 34, 36 of n and p type material to be arranged upon opposed surfaces of an intrinsic material 32. Physical grooving of the intrinsic material provides electrical isolation between these strips. A layer of electrically conductive material is deposited on each individual doped region and a series of electrical contacts 37, 39 are attached to ends of these electrically conductive materials. These contacts are connected to mutually orthogonal resistor arrays 45, 46 which serve as resistive divider networks which split the detector currents before they are transmitted to charge sensitive amplifiers 50, 51, 52, 53.

The output of the charge sensitive amplifiers 50, 51, 52, 53 in conjunction with knowledge concerning the resistive arrays 45, 46 enable the charge and the position of the radiation impinging upon the detector to be determined in a manner analogous to the one dimensional detector analysis discussed with regard to FIG. 3. Further details of the theory of prior art gamma ray camera detectors can be found in the earlier referenced article incorporated in this discussion.

Figure 5:
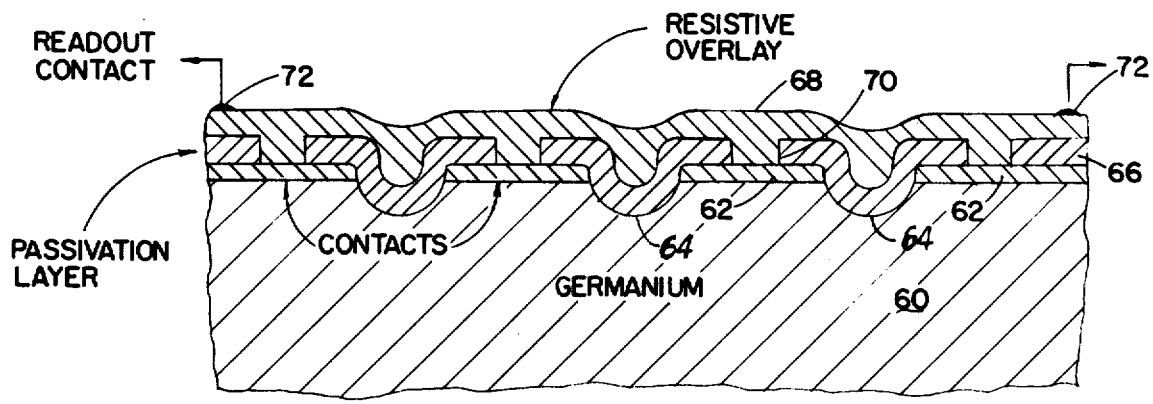
FIG. 5 shows a resistive overlay contact to a grooved p-i-n detector.
Figure 6:
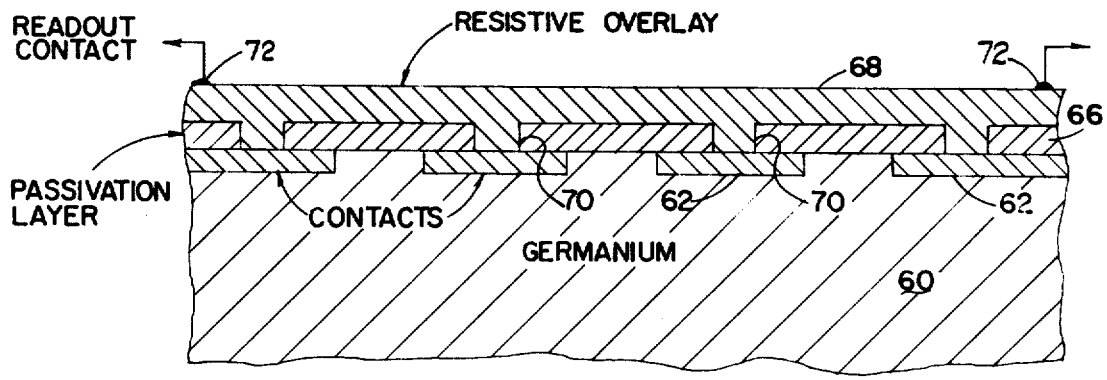
FIG. 6 shows a resistive overlay contact to a grooveless p-i-n detector.

FIGS. 5 and 6 illustrate an improved technique for providing the necessary electrical contact to the doped regions of a semiconductor gamma camera. The technique has applicability for both grooved (FIG. 5) and grooveless (FIG. 6) gamma camera detector arrangements.

As with prior art detectors the present arrangement includes intrinsic 60 and doped 62 regions. In the grooved arrangement, grooves 64 are machined into the intrinsic region to provide electrical isolation between adjacent doped regions. In the grooveless arrangement the intrinsic material extends between the doped regions so a smooth surface of alternating doped and intrinsic material exists.

To protect the p-i-n diode from impurities and provide electrical isolation between doped and intrinsic areas a passivation layer 66 is deposited over both doped 62 and intrinsic 60 regions. The material should provide suitable electrical isolation without degrading the p-i-n diode. It has been found that a layer of silicon monoxide provides a suitable passivation layer. Other materials which provide suitable passivation are silicon dioxide, silicon nitride, germanium oxides and germanium nitrides.

A resistive material 68 is deposited over the passivation layer. The resistive material should comprise a substance either identical or similar to materials used in fabricating integrated circuit resistive elements. The resistive material covers the passivation layer 66 and also extends through a series of gaps 70 positioned in the passivation layer so that the resistive material contacts the doped regions 62. In this way current passes through the gaps 70 to the resistive layer where it splits or divides as discussed with regard to a one dimensional detector. Two contacts 72 are positioned on either side of the resistive layer 68 and allow easy contact of the resistive layer with the charge sensitive amplifiers (See FIG. 4) necessary to provide energy and spatial information according to known techniques. Although only one surface has been illustrated it should be understood that for a two dimensional detector an opposed surface should include oppositely doped impurity bands similarly coated with passivation and resistive layers.

While the invention has been described with a degree of particularity it should be appreciated to those skilled in the art that certain modifications could be made in the invention without departing from the spirit or scope of the invention embodied in the appended claims.

What is claimed is:

1. A semiconductor gamma camera detector comprising:
   (a) a portion of semiconductor material with two surfaces, a first surface including an n doped region and a second surface including a p doped region; said doping configured with the semiconductor material to form a p-i-n diode with a depletion region for producing electrical charge in response to radiation impinging on the semiconductor material;
   (b) a passivation layer substantially covering at least some of said doped regions and defining openings extending therethrough in communication with portions of said doped regions;
   (c) a resistive layer covering at least a part of said passivation layer and extending through said passivation layer openings to contact said regions; and
   (d) electrical connections attached to said resistive layer.

2. The gamma camera detector of claim 1 wherein said two surfaces comprise substantially parallel opposed surfaces of said material.

3. The gamma camera detector of claim 2 wherein the n doped region comprises a first set of linearly oriented parallel bands and the p doped region comprises a second set of linearly oriented parallel bands, said sets oriented orthogonal to each other.

4. The gamma camera detector of claim 3 wherein a said passivation layer is disposed over each of said opposed surfaces and the resistive layer extends through the passivation layer to contact each of said doped bands.

5. The gamma camera detector of claim 4 wherein the resistive layer on each surface has two electrical connections positioned near opposed edges of said resistive layer.

6. A solid state gamma ray detector comprising:
   (a) a portion of intrinsic semiconductor material having at least one regionally doped surface;
   (b) a passivation layer overlying at least a portion of the doped surface and having an opening communicating with a doped region of the surface, and
   (c) a resistive layer overlying the passivation layer and communicating with the doped region via said passivation layer opening.

7. A solid state gamma ray detector comprising:
   (a) a portion of intrinsic semiconductor material having two generally opposite faces, a first of said faces having regionally p-doped parallel strips, a second of said faces having regionally n-doped parallel strips, said p-doped strips and n-doped strips being generally mutually orthogonal;
   (b) passivation material overlying each of said opposite faces and defining openings communicating with each of a plurality of said doped strips on its said respective face;
   (c) a resistive layer overlying at least a portion of the passivation material overlying each face, each resistive layer including resistive material communicating with said doped strips by way of said passivation layer openings, and
   (d) electrical contact attached to each of said resistive layers.

8. A semiconductor gamma camera detector comprising:
   (a) a portion of semiconductor material with two surfaces, a first surface including an n-doped region and a second surface including a metal rectifying contact region; said region forming a p-i-n diode with a depletion region for producing electrical charge in response to radiation impinging on the semiconductor material;
   (b) a passivation layer substantially covering at least some of said doped and surface barrier regions and defining openings extending therethrough in communication with portions of said regions;
   (c) a resistive layer convering at least a pair of said passivation layer and extending through said passivation layer openings to contact said regions; and
   (d) electrical connections attached to said resistive layer.

* * * * *